(12) United States Patent
Veerasamy

(10) Patent No.: US 7,060,322 B2
(45) Date of Patent: Jun. 13, 2006

(54) METHOD OF MAKING HEAT TREATABLE COATED ARTICLE WITH DIAMOND-LIKE CARBON (DLC) COATING

(75) Inventor: Vijayen S. Veerasamy, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 296 days.

(21) Appl. No.: 10/652,858

(22) Filed: Sep. 2, 2003

(65) Prior Publication Data

US 2005/0048284 A1  Mar. 3, 2005

(51) Int. Cl.
  *B05D 5/06* (2006.01)
  *C23C 16/34* (2006.01)
(52) U.S. Cl. .................. 427/154; 427/165; 427/166; 427/249.7; 427/255.36; 427/255.394; 427/376.1; 204/192.1
(58) Field of Classification Search ............. 427/249.7, 427/255.394, 376.1, 165, 166, 255.36, 154; 204/192.1
See application file for complete search history.

(56) References Cited

U.S. PATENT DOCUMENTS

| | | |
|---|---|---|
| 4,898,790 A | 2/1990 | Finley |
| 5,135,808 A | 8/1992 | Kimock et al. |
| 5,470,661 A | 11/1995 | Bailey et al. |
| 5,505,808 A * | 4/1996 | Hallman et al. ............ 156/233 |
| 5,514,476 A | 5/1996 | Hartig et al. |
| 5,527,596 A | 6/1996 | Kimock et al. |
| 5,557,462 A | 9/1996 | Hartig et al. |
| 5,635,245 A | 6/1997 | Kimock et al. |
| 5,688,585 A | 11/1997 | Lingle et al. |
| 5,858,477 A | 1/1999 | Veerasamy et al. |
| 5,888,593 A | 3/1999 | Petrmichl et al. |
| 5,900,342 A | 5/1999 | Visser et al. |
| 6,133,119 A | 10/2000 | Yamazaki |
| 6,261,672 B1 | 7/2001 | de Paoli |
| 6,261,693 B1 | 7/2001 | Veerasamy |
| 6,277,480 B1 | 8/2001 | Veerasamy et al. |
| 6,280,834 B1 | 8/2001 | Veerasamy et al. |
| 6,280,847 B1 | 8/2001 | Corkhill et al. |
| 6,284,377 B1 | 9/2001 | Veerasamy |
| 6,303,225 B1 | 10/2001 | Veerasamy |
| 6,303,226 B1 | 10/2001 | Veerasamy |

(Continued)

FOREIGN PATENT DOCUMENTS

EP    0 605 814    7/1994

(Continued)

OTHER PUBLICATIONS

"Highly tetrahedral, diamond-like amorphous hydrogenated carbon prepared from a plasma beam source", Weiler et al., May 23, 1994, No. 21, pp. 2797-2799.

(Continued)

*Primary Examiner*—Bret Chen
(74) *Attorney, Agent, or Firm*—Nixon & Vanderhye P.C.

(57) ABSTRACT

A method of making a coated article (e.g., window unit), and corresponding coated article are provided. A layer of or including diamond-like carbon (DLC) is formed on a glass substrate, preferably over at least one barrier layer. Then, a protective layer is formed on the substrate over the DLC inclusive layer. During heat treatment (HT), the protective layer prevents the DLC inclusive layer from significantly burning off. Thereafter, the resulting coated glass substrate may be used as desired, it having been HT and including the protective DLC inclusive layer. The protective layer may be removed after HT.

33 Claims, 3 Drawing Sheets

U.S. PATENT DOCUMENTS

| | | | |
|---|---|---|---|
| 6,312,808 B1 | 11/2001 | Veerasamy et al. | |
| 6,335,086 B1 | 1/2002 | Veerasamy | |
| 6,338,901 B1 | 1/2002 | Veerasamy | |
| 6,416,816 B1 * | 7/2002 | Veerasamy et al. | 427/249.7 |
| 6,451,434 B1 | 9/2002 | Ebisawa et al. | |
| 6,531,182 B1 * | 3/2003 | Veerasamy et al. | 427/249.7 |
| 6,558,822 B1 * | 5/2003 | Nagasaka et al. | 428/700 |
| 6,638,570 B1 * | 10/2003 | Veerasamy | 427/249.7 |
| 6,682,773 B1 | 1/2004 | Medwick et al. | |
| 6,849,328 B1 | 2/2005 | Medwick et al. | |
| 6,861,105 B1 * | 3/2005 | Veerasamy | 427/570 |
| 6,878,404 B1 * | 4/2005 | Veerasamy et al. | 427/249.7 |
| 6,904,935 B1 * | 6/2005 | Welty et al. | 137/625.17 |
| 2001/0051273 A1 | 12/2001 | Veerasamy | |
| 2003/0170464 A1 | 9/2003 | Veerasamy | |
| 2004/0180216 A1 | 9/2004 | Veerasamy et al. | |
| 2004/0258926 A1 | 12/2004 | Veerasamy | |
| 2005/0095430 A1 | 5/2005 | Veerasamy | |
| 2005/0095431 A1 | 5/2005 | Veerasamy | |
| 2005/0191494 A1 | 9/2005 | Veerasamy | |

FOREIGN PATENT DOCUMENTS

| | | |
|---|---|---|
| EP | 0 723 944 | 7/1996 |
| WO | WO 00/66506 | 11/2000 |
| WO | WO 02/38515 | 5/2002 |
| WO | WO 03/068502 | 8/2003 |

OTHER PUBLICATIONS

"Optical and Electronic Properties of Amorphous Diamond", Veerasamy et al., 1993, pp. 782-787.

Properties of Ion Beam Deposited Tetrahedral Fluorinated Amorphous Carbon Films, Ronning et al., pp. 335-340, 2000.

"Preparation and Properties of Highly Tetrahedral Hydrogenated Amorphous Carbon", Weiler et al., Jan. 15, 1996, XP-000992913, pp. 1594-1608.

\* cited by examiner

Post-HT

METHOD OF MAKING HEAT TREATABLE COATED ARTICLE WITH DIAMOND-LIKE CARBON (DLC) COATING

This invention relates to a method of making a coated article to be used in a window unit or any other suitable application. For example, certain embodiments of this invention relate to a method of making a window unit (e.g., vehicle window such as vehicle windshield, backlite, sunroof, or sidelite, or IG window unit) including a step of heat treating a glass substrate coated with at least a layer comprising diamond-like carbon (DLC). Other embodiments of this invention relate to such a coated article which may be used in window applications, or any other suitable application.

BACKGROUND OF THE INVENTION

Vehicle windows (e.g., windshields, backlites, sunroofs, and sidelites) are known in the art. For purposes of example, vehicle windshields typically include a pair of bent glass substrates laminated together via a polymer interlayer such as polyvinyl butyral (PVB). It is known that one of the two glass substrates may have a coating (e.g., low-E coating) thereon for solar control purposes such as reflecting IR and/or UV radiation, so that the vehicle interior can be more comfortable in certain weather conditions. Conventional vehicle windshields are made as follows. First and second flat glass substrates are provided, one of them optionally having a low-E coating sputtered thereon. The pair of glass substrates are washed and booked together (i.e., stacked on one another), and then while booked are heat bent together into the desired windshield shape at a high temperature(s) (e.g., 8 minutes at about 600–625 degrees C.). The two bent glass substrates are then laminated together via the polymer interlayer to form the vehicle windshield.

Insulating glass (IG) window units are also known in the art. Conventional IG window units include at least first and second glass substrates (one of which may have a solar control coating on an interior surface thereof) that are coupled to one another via at least one seal(s) or spacer(s). The resulting space or gap between the glass substrates may or may not be filled with gas and/or evacuated to a low pressure in different instances. However, many IG units are required to be tempered. Thermal tempering of the glass substrates for such IG units typically requires heating the glass substrates to temperature(s) of at least about 600 degrees C. for a sufficient period of time to enable thermal tempering.

Other types of coated articles also require heat treatment (HT) (e.g., tempering, heat bending, and/or heat strengthening) in certain applications. For example and without limitation, glass shower doors, glass table tops, and the like require HT in certain instances.

Diamond-like carbon (DLC) is sometimes known for its scratch resistant properties. For example, different types of DLC are discussed in the following U.S. Pat. Nos. 6,303,226; 6,303,225; 6,261,693; 6,338,901; 6,312,808; 6,280,834; 6,284,377; 6,335,086; 5,858,477; 5,635,245; 5,888,593; 5,135,808; 5,900,342; and 5,470,661, all of which are hereby incorporated herein by reference.

It would sometimes be desirable to provide a window unit or other glass article with a protective coating including DLC in order to protect it from scratches and the like. Unfortunately, DLC tends to oxidize and burn off at temperatures of from approximately 380 to 400 degrees C., as the heat treatment is typically conducted in an atmosphere including oxygen. Thus, it will be appreciated that DLC as a protective overcoat cannot withstand heat treatments (HT) at the extremely high temperatures described above which are often required in the manufacture of vehicle windows, IG window units, glass table tops, and/or the like.

Accordingly, those skilled in the art will appreciate that a need in the art exists for a method of providing heat treated (HT) coated articles with a protective coating (one or more layers) comprising DLC. A need for corresponding coated articles, both heat treated and pre-HT, also exists.

BRIEF SUMMARY OF EXAMPLES OF INVENTION

In certain example embodiments of this invention, there is provided a method of making a coated article (e.g., window unit such as for a vehicle, building, or the like), including heat treatment (HT), wherein the coated article includes a coating (one or more layers) comprising diamond-like carbon (DLC).

In certain example embodiments, there is provided a method of making a coated article by: (a) providing at least one barrier layer supported by a glass substrate, (b) coating a glass substrate with a layer comprising DLC over at least the barrier layer, then (c) forming a sacrificial protective layer on the glass substrate over the DLC, and (d) heat treating the coated article with the DLC and the sacrificial protective layer thereon with the protective layer preventing the majority of the DLC from burning off during the heat treatment. Following heat treatment (HT), the sacrificial protective layer may be removed. The resulting heat treated coated article may be used in the context of, for example and without limitation, vehicle windows, architectural windows, insulating glass (IG) window units, shower doors, glass table tops, and/or the like.

In certain example embodiments of this invention, the sacrificial protective layer may comprise zirconium nitride.

In other example embodiments of this invention, the sacrificial protective layer may comprise chromium nitride.

In certain example embodiments of this invention, there is provided a method of making a heat treated coated article, the method comprising: providing a glass substrate; forming at least one layer comprising diamond-like carbon (DLC) on the glass substrate; forming a protective layer comprising a nitride of zirconium and/or chromium on the glass substrate over at least the layer comprising DLC; heat treating the glass substrate with the layer comprising DLC and the protective layer comprising the nitride of zirconium and/or chromium thereon so that during the heat treating the protective layer prevents significant burnoff of the layer comprising DLC; and removing at least part of the protective layer comprising the nitride of zirconium and/or chromium after said heat treating.

In other example embodiments of this invention, there is provided a coated article including a coating supported by a glass substrate, the coating comprising: at least one barrier layer supported by the glass substrate; a layer comprising diamond-like carbon (DLC) on the glass substrate over at least the barrier layer; and a layer comprising a nitride of zirconium and/or chromium on the glass substrate over at least the layer comprising DLC.

DETAILED DESCRIPTION OF EXAMPLES OF THE INVENTION

Figure 1:
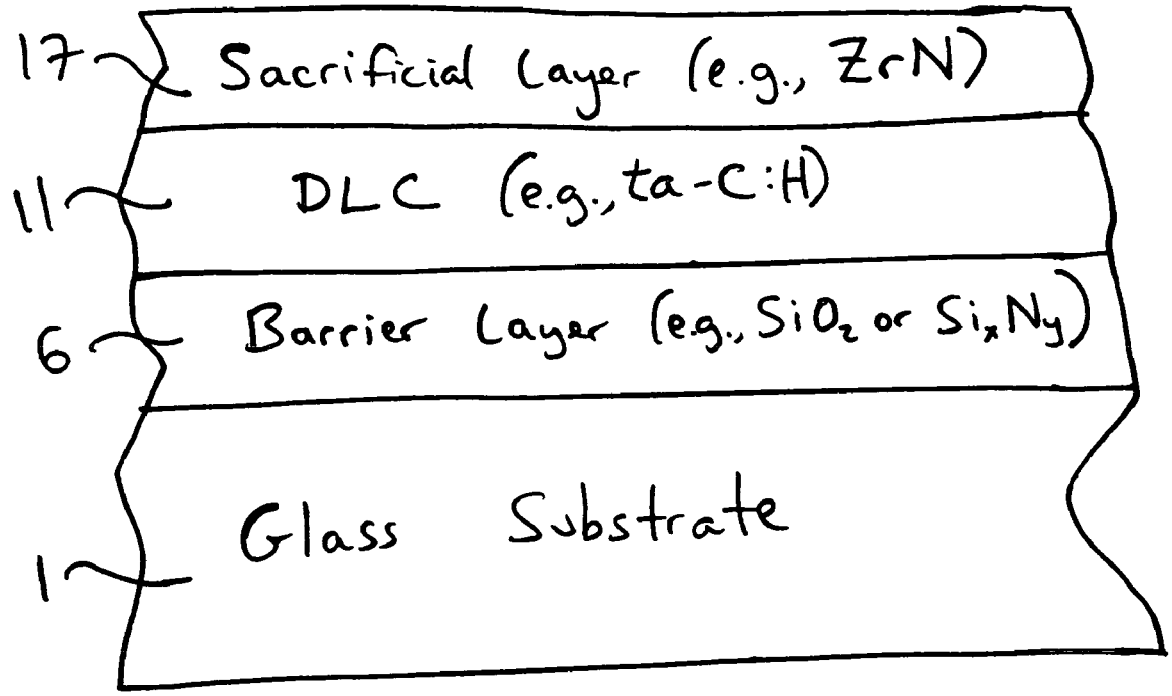
FIG. 1 is a cross sectional view of a coated article, prior to heat treatment, according to an example embodiment of this invention.

Referring now more particularly to the accompanying drawings in which like reference numerals indicate like parts throughout the several views.

Certain example embodiments of this invention relate to methods of making coated articles that may use heat treatment (HT), wherein the coated article includes a coating (one or more layers) including diamond-like carbon (DLC). In certain instances, the HT may involve heating a supporting glass substrate, with the DLC thereon, to temperature(s) of from 550 to 800 degrees C., more preferably from 580 to 800 degrees C. (which is well above the burn-off temperature of DLC). In particular, certain example embodiments of this invention relate to a technique for allowing the DLC to withstand such HT without significantly burning off during the same. In certain embodiments, a sacrificial protective layer is formed on the glass substrate over the DLC so as to reduce the likelihood of the DLC burning off during HT. Thus, the majority (if not all) of the DLC remains on the glass substrate, and does not burn off, during the HT. Following HT, the sacrificial protective layer may or may not be removed in different embodiments of this invention.

FIG. 1 is a cross sectional view of a coated article according to an example embodiment of this invention. Typically, the coated article of FIG. 1 exists during a stage of manufacture prior to heat treatment, but may also exist post-HT in certain instances. The coated article shown in FIG. 1 includes glass substrate 1, at least one barrier layer 6, DLC inclusive layer 11, and sacrificial protective layer 17. Glass substrate 1 is typically of or includes soda-lime-silica glass, although other types of glass may be used in certain instances.

Barrier layer 6 is provided for preventing or reducing oxygen and/or sodium (Na) from migrating from the glass 1 into the DLC 11 during HT. In this respect, barrier layer 6 improves the overall optical characteristics of the coated article post-HT. Barrier layer 6 is preferably of or includes silicon oxide, silicon nitride, silicon oxynitride, and/or the like, although other barrier materials may also be used. Unexpectedly, it has been found that the use of silicon oxide as a barrier layer 6 (compared to silicon nitride) often leads to improved optical results of the final product after heat treatment such as higher visible transmission. Any of the aforesaid barrier layer 6 materials may be doped (e.g., 0.5 to 15%) with Al, stainless steel, or any other metal(s) in certain embodiments of this invention. Barrier layer(s) 6 is formed on the glass substrate 1 via sputtering, or via any other suitable technique. Barrier layer 6 may be from about 10 to 1,000 Å thick in certain example embodiments, more preferably from 50 to 500 Å thick, and most preferably from 50 to 200 Å thick.

DLC inclusive layer 11 may be from about 5 to 1,000 angstroms (Å) thick in certain example embodiments of this invention, more preferably from 10–300 Å thick, and most preferably from 45 to 65 Å thick. In certain example embodiments of this invention, DLC layer 11 may have an average hardness of at least about 10 GPa, more preferably at least about 20 GPa, and most preferably from about 20–90 GPa. Such hardness renders layer (s) 11 resistant to scratching, certain solvents, and/or the like. Layer 11 may, in certain example embodiments, be of or include a special type of DLC known as highly tetrahedral amorphous carbon (t-aC), and may be hydrogenated (t-aC:H) in certain embodiments. In certain hydrogenated embodiments, the t-aC type of DLC may include from 1 to 30% hydrogen, more preferably from 5–20% H, and most preferably from 10–20% H. This t-aC type of DLC includes more $sp^3$ carbon-carbon (C—C) bonds than $sp^2$ carbon-carbon (C—C) bonds. In certain example embodiments, at least about 50% of the carbon-carbon bonds in DLC layer 11 may be $sp^3$ carbon-carbon (C—C) bonds, more preferably at least about 60% of the carbon-carbon bonds in the layer 11 may be $sp^3$ carbon-carbon (C—C) bonds, and most preferably at least about 70% of the carbon-carbon bonds in the layer 11 may be $sp^3$ carbon-carbon (C—C) bonds. In certain example embodiments of this invention, the DLC may have an average density of at least about 2.4 $gm/cm^3$, more preferably at least about 2.7 $gm/cm^3$.

Example linear ion beam sources that may be used to deposit DLC inclusive layer 11 on substrate 1 include any of those in any of U.S. Pat. Nos. 6,261,693, 6,002,208, 6,335, 086, or 6,303,225 (all incorporated herein by reference). When using an ion beam source to deposit layer(s) 11, hydrocarbon feedstock gas(es) (e.g., $C_2H_2$), HMDSO, or any other suitable gas, may be used in the ion beam source in order to cause the source to emit an ion beam toward substrate 1 for forming layer(s) 11. It is noted that the hardness and/or density of layer(s) 11 may be adjusted by varying the ion energy of the depositing apparatus.

DLC layer 11 allows the coated article to be more scratch resistant than if the DLC 11 were not provided. It is noted that while layer 11 is on glass substrate 1 in certain embodiments of this invention, additional layer(s) 6 may or may not be under layer 11 between the substrate 1 and layer 11 in certain example embodiments of this invention. Thus, the phrase "on the substrate" as used herein is not limited to being in direct contact with the substrate as other layer(s) may still be provided therebetween.

For example and without limitation, the layer 11 of or including DLC may be any of the DLC inclusive layers of any of U.S. Pat. Nos. 6,592,993; 6,592,992; 6,531,182; 6,461,731; 6,447,891; 6,303,226; 6,303,225; 6,261,693; 6,338,901; 6,312,808; 6,280,834; 6,284,377; 6,335,086; 5,858,477; 5,635,245; 5,888,593; 5,135,808; 5,900,342; or 5,470,661 (all of these patents hereby being incorporated herein by reference), or alternatively may be any other suitable type of DLC inclusive layer. DLC inclusive layer 11 may be hydrophobic (high contact angle), hydrophilic (low contact angle), or neither, in different embodiments of this invention.

Sacrificial protective layer 17 is provided in order to protect DLC layer 11 during HT. If layer 17 were not provided, the DLC would significantly oxidize during HT and burn off, thereby rendering the final product defenseless against scratching. However, the presence of sacrificial protective layer 17 prevents or reduces the amount of oxygen which can reach the DLC 11 during HT from the surrounding atmosphere, thereby preventing the DLC from significantly oxidizing during HT. As a result, after HT, the DLC inclusive layer 11 remains on the glass substrate 1 in order to provide scratch resistance and/or the like.

It has surprisingly been found that the use of zirconium nitride (e.g., ZrN) in sacrificial protective barrier layer 17 is especially beneficial with respect to reducing and/or preventing oxygen diffusion into the DLC during HT. The sacrificial barrier layer 17 of or including zirconium nitride may be from about 300 to 600 Å thick in certain example embodiments of this invention, more preferably from 450 to 480 Å thick. Zirconium nitride is a very dense material, and provides for an excellent barrier against oxygen diffusion into the DLC during HT.

In certain example embodiments of this invention, zirconium nitride layer 17 may have a density of at least 6 gm/cm$^3$, more preferably at least 7 gm/cm$^3$. Additionally, in certain example embodiments, zirconium nitride layer 17 may have an average hardness of at least 650 kgf/mm, more preferably of at least 700 kgf/mm, and/or may have a bond overlap population of at least 0.25 (more preferably at least about 0.30) for strength purposes. In certain example instances, many of the Zr—N bonds in layer 17 are of the covalent type, which are stronger than ionic bonds, for strength purposes. It is also noted that in certain example embodiments of this invention, the ZrN of layer 17 may have a melting point of at least 2,500 degrees C., and it may be about 2,980 degrees C. in certain example instances.

The zirconium nitride of layer 17 may or may not be doped with other material(s) in different embodiments of this invention. In certain example embodiments of this invention, the zirconium nitride of layer 17 is not doped with any other material. However, in other example embodiments of this invention, the zirconium nitride of layer 17 may be doped with Cu and/or Ni (e.g., from about 0–15%, more preferably from about 1–10%) in order to provide added stability and/or strength. The presence of a dopant such as Cu and/or Ni in the ZrN may help the ZrN to be more stable during HT and may, for example, prevent or reduce phase changes (e.g., a change to ZrO) of the ZrN during HT. Moreover, in certain example instances, Ni dopant in the ZrN layer 7 may serve as an oxygen getter in the ZrN layer, thereby allowing the layer 7 to better function as an oxygen barrier preventing or reducing oxygen diffusion into the DLC 11 during HT.

In certain example embodiments of this invention, the zirconium nitride of layer 17 may be represented by $Zr_xN_y$, where the ratio x:y is from 0.8 to 1.2, and is preferably about 1.0 in certain example embodiments.

In other example embodiments of this invention, the Zr in layer 17 may be replaced by Cr (or NiCr). Thus, in such embodiments, layer 17 may comprise CrN, where this CrN layer may or may not be doped with Ni or the like in the manner and amount(s) explained above.

Figure 2A:
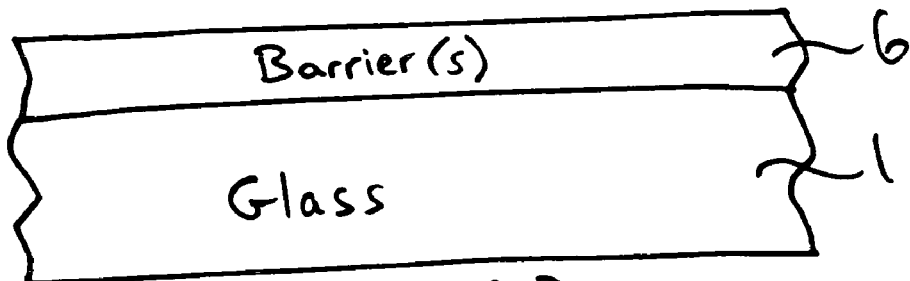
FIGS. 2(a)–2(c) are cross sectional views illustrating certain steps carried out in making a coated article according to an example embodiment of this invention.
Figure 2B:
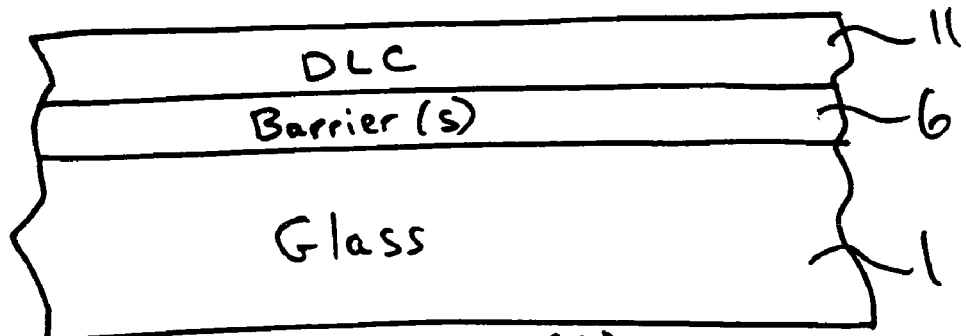
Figure 2C:
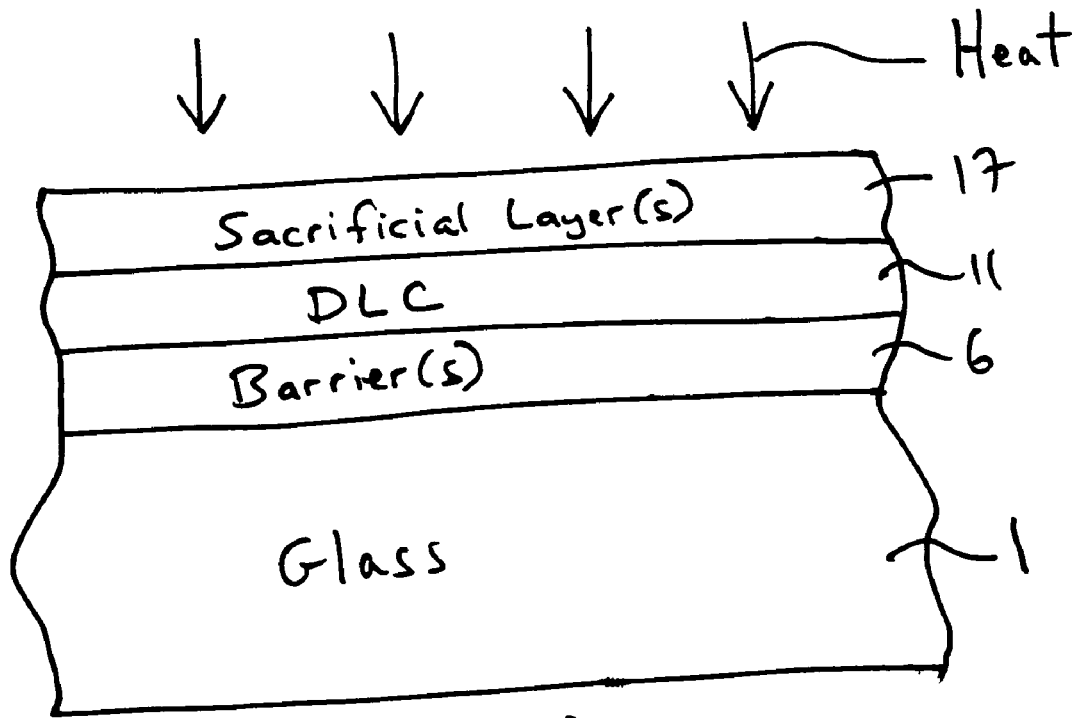

An example process of manufacturing a window unit or the like will now be described, with reference to FIGS. 2–3. Initially, as shown in FIG. 2(*a*), glass substrate 1 is provided, and at least one barrier layer 6 (e.g., silicon oxide, silicon nitride, silicon oxynitride, or the like) is sputtered on a surface thereof. Optionally, a multi-layer solar control coating (not shown) may be deposited (e.g., via sputtering) on the surface of the glass substrate 1 opposite the barrier layer 6. As shown in FIG. 2(*b*), at least one layer 11 of or including DLC is deposited (e.g., via ion beam deposition) on the glass substrate 1 over at least the barrier layer 6. Then, as shown in FIG. 2(*c*), a protective layer 17 is deposited on the substrate 1 over the DLC inclusive layer 11. Protective layer 17 may be deposited via sputtering, CVD, ion beam deposition, or any other suitable technique. In one example embodiment of this invention, protective layer 17 may be of or include zirconium nitride as explained above.

While layer 17 may comprise zirconium nitride in certain embodiments, this invention is not so limited. Alternatively, instead of zirconium nitride, layer 17 may be of or include one or more of: chromium nitride, nickel-chrome nitride, amorphous silicon, silicon nitride, silicon oxide, silicon oxynitride, $BC_x$ (boron carbide where x is from 0.75 to 1.5), $TiC_x$ (titanium carbide, where x is from 0.47 to 0.99—this may be oxidation resistant), $HfC_x$ (hafnium carbide, where x is from 0.47 to 0.99), $Ti_xHf_yC$ (titanium hafnium carbide, where in certain non-limiting examples x may be about 0.6 and y may be about 0.4), $TaC_x$ (tantalum carbide, where x is from 0.47 to 0.99), $ZrC_x$ (zirconium carbide, where x is from 0.47 to 0.99), Cr, NiCr, $NiCrO_x$, Ti, a removable slurry of magnesium oxide, and/or $TiO_x$. Certain of these other materials are discussed in related U.S. patent application Ser. No. 10/091,589, filed Mar. 7, 2002, the disclosure of which is hereby incorporated herein by reference.

Optionally, a thin protective layer comprising DLC or the like (not shown) may be provided over sacrificial layer 17 prior to HT, in order to prevent the layer 17 from peeling off too early (i.e., to prevent sacrificial layer 17 from peeling off before HT or during early stages of HT). An example of such a protective layer n(not shown) is a thin DLC layer about 10–30 Å thick, or any other suitable material which may burn off during HT or which may be easily removed after HT. Such a thin DLC layer (not shown) over the sacrificial layer 17 would quickly burn off during HT.

As shown in FIG. 2(*c*), the glass substrate 1 with at least layers 6, 11 and 17 thereon is then heat treated (HT) for purposes of thermal tempering, heat bending, heat strengthening, and/or the like. At least part of this HT may be conducted, for example, in an atmosphere including oxygen as known in the art at temperature(s) of from 550 to 800 degrees C., more preferably from 580 to 800 degrees C. (i.e., temperature(s) above the burn-off temperature of DLC). The HT may last for at least one minute, more preferably from 1–10 minutes, in certain example non-limiting embodiments of this invention. During HT, the presence of protective layer 17 protects DLC inclusive layer 11 from the HT and prevents layer 11 from burning off due to significant oxidation. While in some instances some of layer 11 may burn off during HT, the majority if not all of DLC inclusive layer 11 remains on the substrate 1 even after the HT due to the presence of protective layer 17.

A significant advantage associated with using zirconium nitride in layer 17 is its ease of removal after HT. Protective layers such as silicon nitride are sometime undesirable since they require complex etching in order to remove the same after HT. On the other hand, it has been found that when layer 17 is made of zirconium nitride, the layer 17 tends to start peeling off on its own and/or be easily removed after HT. It is believed that the zirconium nitride layer 17 is so easy to remove from the DLC 11 after HT due to stresses associated with layer 17 and the thermal mismatch between the layers 11 and 17. In particular, the intrinsic compressive stress of zirconium nitride layer 17, combined with thermally induced stress therein in the same direction, causes delamination of layer 17 to either automatically occur, or easily occur after HT.

Removal of zirconium nitride layer 17 from the DLC after HT may be aided by rubbing the coated article with Windex™, water, alcohol, a solution including ammonium hydroxide, and/or the like. Rubbing with such liquids may be especially beneficial in removing layer 17 after HT when the coated article is still warm therefrom (e.g., when the layer 17 is from about 80–200 degrees C., more preferably from about 100–180 degrees C.).

Figure 3:
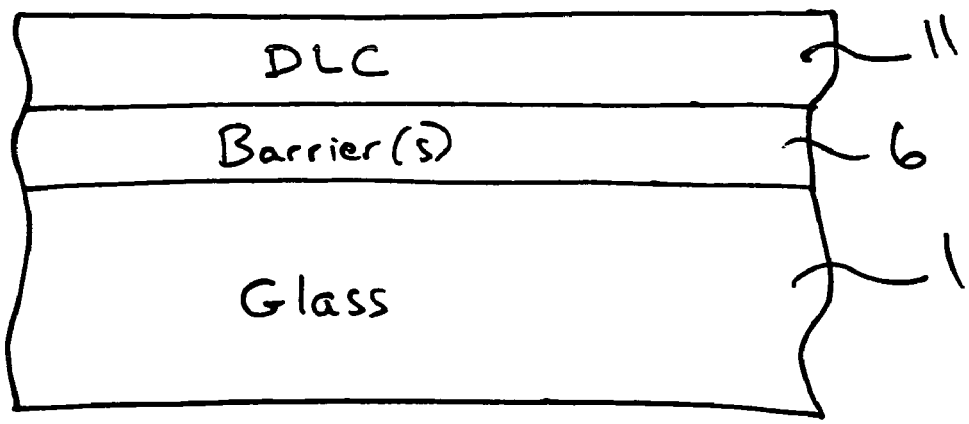
FIG. 3 is a cross sectional view of a coated article made via the FIG. 2 process according to an example embodiment of this invention.

After layer 17 has been removed, the remaining coated article is shown in FIG. 3 and includes an outer layer comprising scratch resistant DLC. The aforesaid processes are advantageous in that they provide a technique for allowing a coated article including a protective DLC inclusive layer to be heat treated without the DLC layer burning off during such HT. In other words, it becomes possible to provide a protective DLC inclusive layer 11 on a product in a commercially acceptable manner.

According to certain example embodiments of this invention, coated articles herein lose no more than about 15% of their visible transmission due to HT, more preferably no more than about 10%. Moreover, monolithic coated articles herein preferably have a visible transmission after HT of at least about 70%, more preferably of at least about 75%. As an example, visible transmission of a monolithic coated article may drop from about 85% to about 78% due to HT.

The coated article of FIG. 3 may be used in various applications, including but not limited to IG window units, laminated vehicle windshields, other types of vehicle windows, furniture applications, and/or the like. As an example, the coated article of FIG. 3 may be used in an IG (insulating glass) window unit as shown in FIG. 4.

Figure 4:
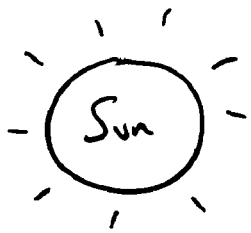
FIG. 4 is a cross sectional view of an IG window unit which includes the coated article of FIG. 3 according to an example embodiment of this invention.
Figure 4:
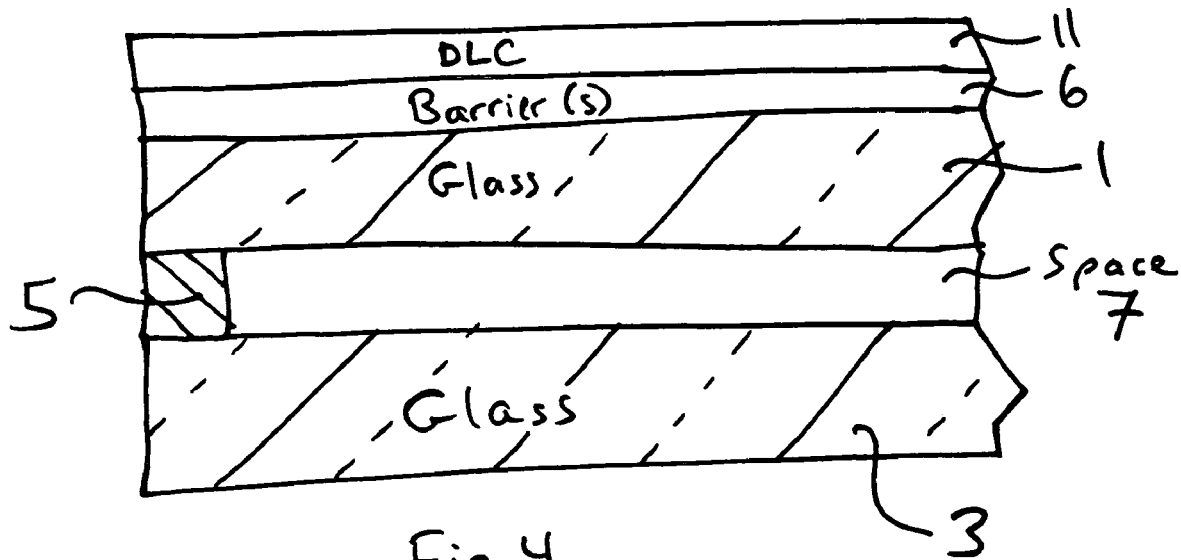

The FIG. 4 IG window unit includes first glass substrate 1 and second glass substrate 3 which are sealed together and/or spaced from one another via one or more spacers/seals 5. The gap or space 7 defined between the opposing substrates 1 and 3 may or may not be filled with gas (e.g., Ar) and may or may not be evacuated to a pressure lower than atmospheric in different embodiments of this invention. Glass substrate(s) 1 and/or 3 may be soda-lime-silica glass (e.g., made via the known float process), or any other suitable type of glass (e.g., borosilicate glass) in different embodiments of this invention. Each substrate 1, 3 may be from about 1 to 10 mm thick, more preferably from 2 to 5 mm thick, and most preferably from about 2.5 to 3.6 mm thick in certain example embodiments of this invention.

Still referring to FIG. 4, optionally, substrate 1 and/or 3 may have a solar control coating (e.g., multi-layer low-E coating) (not shown) provided on an interior surface thereof facing the other substrate. For example and without limitation, the solar control coating may include any of the coatings in any of U.S. Pat. Nos. 5,688,585, 5,557,462, 4,898,790, 5,514,476, 3,682,528, 5,376,455, 5,377,045, 5,514,476, 5,770,321, 5,902,505, 5,942,338, 6,059,909, 6,060,178, 6,132,881, or 6,159,607, or commonly owned U.S. Ser. No. 09/794,224 (see WO 02/04375), all of which are hereby incorporated herein by reference. Many of these solar control coatings include at least one (and sometimes multiple) IR reflecting layer (e.g., including or of Ag and/or NiCr) sandwiched between a pair of dielectric layers; where the dielectric layers may or may not contact the Ag or NiCr. However, the instant invention is not so limited, and any other type of solar control coating may instead be used in different instances. In certain example embodiments of this invention, the IG window unit of FIG. 4 has a visible transmission of at least 50%, more preferably of at least 60%, and in some cases at least 70%.

EXAMPLE

For purposes of example, and without limitation, the following example coated article was made and tested according to an example embodiment of this invention. A silicon nitride barrier layer 6 about 100 Å thick, a DLC (ta-C:H type) layer 11 about 70 Å thick, and a sacrificial protective ZrN barrier layer 17 about 460 Å thick were deposited on a soda-lime-silica glass substrate 1 as shown in FIG. 1. Prior to heat treatment, the coated article had a visible transmission of over 80%. The coated article was then heat treated at a temperature of about 625 degrees C. As a result of this heat treatment, the sacrificial ZrN layer 17 began to delaminate from the DLC 11 on its own due to both intrinsic and thermal mismatch induced stress. Layer 17 was then wiped off using a paper towel and Windex™. The visible transmission of the monolithic coated article after heat treatment and after the layer 17 was wiped off was as high as about 78%. The scratch load for the sample was above 50 lbs, though it may be lower than this in certain embodiments.

Finally, it is noted that an XPS plot (not shown) has indicated that as a result of the HT, Si and N from a silicon nitride barrier layer 6 may migrate into the DLC layer 11 at least at an interface portion thereof, as well as some oxygen. However, this is not particularly problematic since only small amounts of oxygen are involved. Additionally, after HT, there typically are virtually no traces of Zr at the DLC surface after the aforesaid ZrN removal.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

The invention claimed is:

1. A method of making a heat treated coated article, the method comprising:
   providing a glass substrate;
   forming at least one layer comprising diamond-like carbon (DLC) on the glass substrate;
   forming a protective layer comprising zirconium nitride on the glass substrate over at least the layer comprising DLC;
   heat treating the glass substrate with the layer comprising DLC and the protective layer comprising zirconium nitride thereon so that during the heat treating the protective layer comprising zirconium nitride prevents significant burnoff of the layer comprising DLC, wherein the heat treating comprises heating the glass substrate to temperature(s) sufficient for thermal tempering, heat strengthening, and/or heat bending; and
   removing at least part of the protective layer comprising zirconium nitride after said heat treating.

2. The method of claim 1, wherein the layer comprising DLC is formed via an ion beam.

3. The method of claim 2, wherein the protective layer comprising zirconium nitride is at least partially formed on the glass substrate via sputtering.

4. The method of claim 1, further comprising sputtering a solar control multi-layer coating onto a surface of the glass substrate so that the solar control coating and the layer comprising DLC are formed on opposite sides of the glass substrate.

5. The method of claim 4, wherein the solar control coating comprises at least first and second dielectric layers, and an infrared (IR) reflecting layer comprising one of Ag and NiCr provided between the dielectric layers.

6. The method of claim 1, further comprising forming a barrier layer comprising silicon oxide and/or silicon nitride on the glass substrate so as to be located between at least the glass substrate and the layer comprising DLC.

7. The method of claim 1, further comprising, after said heat treating, coupling the glass substrate with the layer comprising DLC thereon to another glass substrate in making an IG window unit.

8. The method of claim 1, wherein the protective layer comprising zirconium nitride is doped with Ni and/or Cu.

9. The method of claim 1, wherein the heat treating comprises heating the glass substrate with the layer comprising DLC and the protective layer thereon using at least temperature(s) of at least 550 degrees C.

10. The method of claim 1, wherein the heat treating comprises heating the glass substrate with the layer comprising DLC and the protective layer thereon using at least temperature(s) of at least 580 degrees C.

11. The method of claim 1, wherein the layer comprising DLC comprises amorphous DLC and has more $sp^3$ carbon-carbon bonds than $sp^2$ carbon-carbon bonds.

12. The method of claim 11, wherein the layer comprising DLC has an average hardness of at least 10 GPa.

13. The method of claim 11, wherein the layer comprising DLC has an average hardness of at least 20 GPa.

14. The method of claim 1, wherein the layer comprising DLC has a density of at least about 2.7 $gm/cm^3$, and wherein the layer comprising DLC is hydrogenated.

15. The method of claim 1, wherein the layer comprising DLC comprises hydrogenated highly tetrahedral amorphous carbon (ta-C:H).

16. The method of claim 1, wherein the protective layer comprising zirconium nitride is from 300 to 600 Å thick.

17. The method of claim 1, wherein the protective layer comprising zirconium nitride is from 450 to 480 Å thick.

18. A method of making a heat treated coated article, the method comprising:
providing a glass substrate;
forming at least one layer comprising diamond-like carbon (DLC) on the glass substrate;
forming a protective layer comprising a nitride of zirconium and/or chromium on the glass substrate over at least the layer comprising DLC;
heat treating the glass substrate with the layer comprising DLC and the protective layer comprising the nitride of zirconium and/or chromium thereon so that during the heat treating the protective layer prevents significant burnoff of the layer comprising DLC; and
removing at least part of the protective layer comprising the nitride of zirconium and/or chromium after said heat treating.

19. The method of claim 18, wherein the layer comprising DLC is formed via an ion beam.

20. The method of claim 18, wherein the protective layer is at least partially formed via sputtering.

21. The method of claim 18, further comprising sputtering a solar control multi-layer coating onto a surface of the glass substrate so that the solar control coating and the layer comprising DLC are formed on opposite sides of the glass substrate.

22. The method of claim 21, wherein the solar control coating comprises at least first and second dielectric layers, and an infrared (IR) reflecting layer comprising one of Ag and NiCr provided between the dielectric layers.

23. The method of claim 18, further comprising forming a barrier layer on the glass substrate so as to be located between at least the glass substrate and the layer comprising DLC.

24. The method of claim 23, wherein the barrier layer comprises silicon oxide and/or silicon nitride, and wherein the method further comprises, after said heat treating, coupling the glass substrate with the layer comprising DLC thereon to another glass substrate to form an IG window unit.

25. The method of claim 18, wherein the protective layer comprising the nitride of zirconium and/or chromium is doped with Ni and/or Cu.

26. The method of claim 18, wherein the heat treating comprises heating the glass substrate with the layer comprising DLC and the protective layer thereon using at least temperature(s) of at least 550 degrees C.

27. The method of claim 18, wherein the layer comprising DLC comprises amorphous DLC and has more $sp^3$ carbon-carbon bonds than $sp^2$ carbon-carbon bonds.

28. The method of claim 27, wherein the layer comprising DLC has an average hardness of at least 10 GPa.

29. The method of claim 27, wherein the layer comprising DLC has a density of at least about 2.7 $gm/cm^3$, and wherein the layer comprising DLC is hydrogenated.

30. The method of claim 18, wherein the protective layer comprising the nitride of zirconium and/or chromium is from 300 to 600 Å thick.

31. The method of claim 18, wherein the protective layer comprising the nitride of zirconium and/or chromium is from 450 to 480 Å thick.

32. The method of claim 18, wherein the protective layer comprises chromium nitride.

33. The method of claim 18, wherein the protective layer comprises a nitride of NiCr.

* * * * *